(12) United States Patent
Gahinet

(10) Patent No.: US 7,890,198 B1
(45) Date of Patent: Feb. 15, 2011

(54) TOOL FOR DESIGN OF MULTIPLE SINGLE-INPUT-SINGLE-OUTPUT CONTROL LOOPS

(75) Inventor: Pascal Gahinet, Hopkinton, MA (US)

(73) Assignee: The MathWorks, Inc., Natick, MA (US)

( * ) Notice: Subject to any disclaimer, the term of this patent is extended or adjusted under 35 U.S.C. 154(b) by 734 days.

(21) Appl. No.: 10/869,163

(22) Filed: Jun. 15, 2004

(51) Int. Cl.
G05B 13/02 (2006.01)
G05B 15/00 (2006.01)
G06G 7/48 (2006.01)
G06G 7/62 (2006.01)

(52) U.S. Cl. .............................. 700/31; 700/29; 700/83; 703/6; 703/13

(58) Field of Classification Search .................. 700/8, 700/9, 17, 19, 28, 29, 31, 42, 52, 79, 83; 706/14; 703/3, 4, 6, 7, 13, 14
See application file for complete search history.

(56) References Cited

U.S. PATENT DOCUMENTS

| | | | |
|---|---|---|---|
| 6,487,590 B1 * | 11/2002 | Foley et al. | 709/223 |
| 6,510,353 B1 * | 1/2003 | Gudaz et al. | 700/37 |
| 6,907,308 B1 * | 6/2005 | Bartlett et al. | 700/121 |
| 7,089,530 B1 * | 8/2006 | Dardinski et al. | 717/105 |
| 2003/0014130 A1 * | 1/2003 | Grumelart | 700/28 |
| 2004/0075689 A1 * | 4/2004 | Schleiss et al. | 345/771 |
| 2005/0033453 A1 * | 2/2005 | Coogan et al. | 700/2 |
| 2005/0256735 A1 * | 11/2005 | Bayne | 705/1 |
| 2006/0112382 A1 * | 5/2006 | Glass et al. | 717/168 |
| 2006/0276917 A1 * | 12/2006 | Li et al. | 700/83 |
| 2008/0172212 A1 * | 7/2008 | Gahinet et al. | 703/6 |

FOREIGN PATENT DOCUMENTS

WO    WO 2004001575 A1 * 12/2003

OTHER PUBLICATIONS

"LabVIEW: Control Design Toolkit User Manual"; National Instruments; (Mar. 2004); pp. (1-1)-(13-4).*
"Control System Toolbox: For Use with Matlab", The MathWorks, Inc, Jan. 1999 http://www-lar.deis.unibo.it/~Imarconi/files/control_tb.pdf.*

(Continued)

Primary Examiner—Albert DeCady
Assistant Examiner—Jennifer L Norton
(74) Attorney, Agent, or Firm—Nelson Mullins Riley & Scarborough LLP; Kevin J. Canning; Neslihan I. Doran

(57) ABSTRACT

A method and apparatus create a general framework for representing and manipulating control systems having a plurality of SISO feedback loops or, more generally, SISO "compensators" to be designed or tuned. A graphical user interface (GUI) design tool can include graphical interfaces, such as editors, which users can utilize to modify such variables as gain and other dynamics of each SISO compensator. Changes made to one SISO compensator generate different outputs, which are automatically translated to the other SISO compensators of the DSCS. There is a linking of interfaces and/or editors, such that changes made in one that affect another are automatically displayed accordingly. Such an arrangement provides for performance measuring views that provide real-time visual feedback on the effect of modified parameters on global performance. Different configuration tools can be utilized in conjunction with the present invention to enable a user to experiment with different design scenarios and compare results.

41 Claims, 12 Drawing Sheets

OTHER PUBLICATIONS

"Control System Toolbox: For use with Matlab, Getting Started: Version 5", The MathWorks, Inc, Jun. 2001 http://site.ntvc.edu.cn/jx/jpkc/zkyl/syjx/pdf/02.pdf.*

Simulink Control Design 3.0: Cascaded Multi-Loop/Multi-Compensator Feedback Design, May 23, 2009 http://www.mathworks.com/products/simcontrol/demos.html?file=/products/demos/shipping/slcontrol/scdairframectrldespad.html.*

Wittenmark, B., et al. "Dynamic Pictures and Interactive Learning." *IEEE Control Systems*. Jun. 1998; 26-32.

"Control System Toolbox Release Notes." Online Publication. 1-2-4-4.

* cited by examiner

TOOL FOR DESIGN OF MULTIPLE SINGLE-INPUT-SINGLE-OUTPUT CONTROL LOOPS

FIELD OF THE INVENTION

The present invention relates to a general framework for representing, manipulating, and designing control systems having a plurality of single input single output (SISO) feedback loops, and more specifically to a design tool for creating and tuning SISO compensators in a control system.

BACKGROUND OF THE INVENTION

A dynamic system (either natural or man-made) is a system whose response at any given time is a function of its input stimuli, its current state, and the current time. Such systems range from simple to highly complex systems. Physical dynamic systems include a falling body, the rotation of the earth, bio-mechanical systems (muscles, joints, etc.), biochemical systems (gene expression, protein pathways), weather and climate pattern systems, etc. Examples of man-made or engineered dynamic systems include: a bouncing ball, a spring with a mass tied on an end, automobiles, airplanes, control systems in major appliances, communication networks, audio signal processing, nuclear reactors, a stock market, etc.

Professionals from diverse areas such as engineering, science, education, and economics build mathematical models of dynamic systems in order to better understand system behavior as it changes with the progression of time. The mathematical models aid in building "better" systems, where "better" may be defined in terms of a variety of performance measures such as quality, time-to-market, cost, speed, size, power consumption, robustness, etc. The mathematical models also aid in analyzing, debugging and repairing existing systems (be it the human body or the anti-lock braking system in a car). The models may also serve an educational purpose of educating others on the basic principles governing physical systems. The models and results are often used as a scientific communication medium between humans. The term "model-based design" is used to refer to the use of graphical models in the development, analysis, and validation of dynamic systems.

Dynamic systems are typically modeled in simulation environments as sets of differential, difference, and/or algebraic equations. At any given instant of time, these equations may be viewed as relationships between the system's output response ("outputs"), the system's input stimuli ("inputs") at that time, the current state of the system, the system parameters, and time. The state of the system may be thought of as a numerical representation of the dynamically changing configuration of the system. For instance, in a physical system modeling a simple pendulum, the state may be viewed as the current position and velocity of the pendulum. Similarly, a signal-processing system that filters a signal would maintain a set of previous inputs as the state. The system parameters are the numerical representation of the static (unchanging) configuration of the system and may be viewed as constant coefficients in the system's equations. For the pendulum example, a parameter is the length of pendulum and for the filter example; a parameter is the values of the filter taps.

In practice, except for the most basic systems, mathematical models for dynamic systems involve a complex set of mathematical transformations applied in some prescribed manner with the outputs of some transformations forming the inputs of others. Each elemental transformation may be viewed in isolation as a simple dynamic system falling into one of the categories listed above. Therefore, a complex dynamic system may be modeled as an interconnection of various simple dynamic systems.

A schematic representation of such an interconnection that has evolved over the years is the graphical model. Such graphical models have now become a standard means in textbooks, design papers, journal articles, and specifications to communicate the details of a dynamic system's behavior. Various classes of graphical models describe computations that can be performed on computational hardware, such as a computer, microcontroller, FPGA, and custom hardware. Classes of such graphical models include time-based block diagrams, such as those found within Simulink®, from The MathWorks, Inc. of Natick, Mass., state-based and flow diagrams, such as those found within Stateflow®, from The MathWorks, Inc. of Natick, Mass., data-flow diagrams, circuit diagrams, and software diagrams, such as those found in the Unified Modeling Language. A common characteristic among these various forms of graphical models is that they define semantics on how to execute the model.

Generally, graphical analysis and simulation methods, such as the block diagram method, are used in modeling for design, analysis, and synthesis of engineered systems. The visual representation allows for a convenient interpretation of model components and structure and provides a quick intuitive notion of system behavior.

Conventional simulation models become more complex as models are developed that model more complex systems. Hundreds of thousands of blocks that represent primitive and aggregate mathematical operations may be present. To manage the complexity of such models, principles of partitioning, abstraction, and hierarchy are applied.

In addition to graphical based modeling or simulation, other applications can be utilized to model a system, such as a control system or dynamic system. For example, MATLAB®, provided by The Mathworks, Inc. of Natick, Mass., is an interactive programming and interpretive application that can implement a variety of computing tasks in engineering and science, while also having the ability to execute other executable programs. Some of the tasks that MATLAB® can perform range from data acquisition and analysis to application development. The MATLAB® environment integrates mathematical computing, visualization, and technical programming language. MATLAB® includes built-in interfaces that provide access and import data from instruments, files, and external databases and programs.

In addition, MATLAB® can integrate external routines written in C, C++, Fortran, and Java with MATLAB® applications. As such, MATLAB® provides an example of interactive programming and interpretive environments that can work in conjunction with C routines provided external to MATLAB®, including those provided by third party providers.

Turning now to control systems, specifically feedback control systems, such systems can be designed and modeled based on conventional graphical model methodology. For example, FIG. 1 illustrates a basic controller sequence modeled using a graphical model format. There is a reference "u" provided to a controller 500 that controls an operation in a plant 502. This results in an output "y", which is both output and communicated back to a Sum operation 504 for input to the controller 500.

However, in real world applications a model of a plant and corresponding controller(s) is far more complex. Most control systems are MIMO (multi-input multi-output) in nature. While direct MIMO methods exist, they tend to require a centralized, lumped, compensator, which is often impractical in real-world applications. Accordingly, the alternative configuration often utilized is a plurality of decentralized multi-loop SISO compensators, such as a PID controller. FIG. 2 is an illustration of a more likely model of plant operations, and the various controllers and variables that may be encountered in a simulation. A plant 510 has a first controller 512, a second controller 514, up to "n" controllers 516. There are multiple inputs to the first, second, and n controllers 512, 514, and 516 in the form of a first reference 518, a second reference 520, operating conditions 522, a first disturbance 524, and a second disturbance 526. The controllers 512, 514, and 516 control the plant 510 and produce a first output 528 and a second output 530. The behavior of the control system is dependent upon multiple inputs, complex operating conditions, multiple control elements, and multiple output signals. The plant 510 is nonlinear. To use corresponding language, there are a plurality of single input single output (SISO) controllers, feedback loops, or compensators, that must be designed and subsequently tuned in complex control systems. In such a situation, engineers are forced to design control systems and portions of control systems without taking into account dynamics that result from a change in SISO inputs across the entire plant 510. It would be more efficient and desirable to be able to model the feedback of specified inputs to SISO controllers across a larger complex control system, such as the one modeling the plant 510, so that a more accurate dynamic system model can be achieved.

SUMMARY OF THE INVENTION

There is a need for a framework for representing and manipulating control systems involving a plurality of SISO compensators to be designed or tuned. There is a further need for a graphical environment for interactively tuning design parameters and receiving feedback on how the tuning process effects a larger control system or dynamic system model. The present invention is directed toward further solutions to address these needs.

Prior to discussion of the invention, it should be noted that the present invention operates on linear time-invariant (LTI) models and compensators. However, the tools of the present invention are not limited to linear control system design as they can be combined with linearization and gain scheduling techniques to assist in the design and tuning of general nonlinear control systems.

Accordingly, the present invention is useful in the design of any type of LTI model, including but not limited to continuous, discrete, hybrid, and multirate models, models with time delays, and models specified by measured frequency response data. The present invention provides insight into time responses (time-domain behavior) of control systems, as well as frequency-domain characteristics, and poles and zero dynamics. A number of different linear analysis techniques can be employed within this framework.

In addition to analytical design techniques such as root locus and Bode or Nichols loop shaping, the framework of the present invention supports the deployment of systematic, automated tuning techniques, such as direct search, genetic algorithms, gradient-based optimization. These techniques can optimize a variety of time and frequency-domain criteria.

In accordance with one aspect of the present invention, in an electronic device, a method of manipulating a control system representation having a plurality of distributed single input single output (SISO) compensators includes the step of modifying the parameter in a first SISO compensator of the plurality of distributed SISO compensators with a modification in accordance with the instruction. The first SISO compensator is operated to generate a resulting output. A remainder of the plurality of SISO compensators are then automatically updated with the modification to the first SISO compensator and with the resulting output of the first SISO compensator contemporaneous with the steps of modifying the parameter and operating the first SISO compensator. Accordingly, changing compensator parameters in one loop can have repercussions in other loops, all of which are updated to provide real time insight into such repercussions.

In accordance with aspects of the present invention, the method further includes providing a plurality of interfaces, such that there is at least one interface for each of the plurality of SISO compensators. The plurality of interfaces can be of a type including a graphical editor instance and/or a text editor instance.

In accordance with further aspects of the present invention, the instruction to modify is received by a first interface that is in communication with the first SISO compensator. The step of modifying the parameter in the first SISO compensator can include the first interface executing the modification to modify the parameter.

In accordance with further aspects of the present invention, the method can further include providing an editing graphical user interface (GUI) displaying at least one of a plurality of editor instances for modifying parameters of the plurality of SISO compensators. The method can also include providing a display graphical user interface (GUI) for displaying outputs generated by at least one of the plurality of SISO compensators. The method can further include providing a configuration graphical user interface (GUI) for providing user access to a plurality of tools for refining a design of the dynamic system representation. The plurality of tools can include an open loop tool, a closed loop tool, a Bode plot tool, a Nichols plot tool, a root/locus tool, a discretization tool, and/or a tuning tool.

In accordance with further aspects of the present invention, the step of automatically updating a remainder of the plurality of SISO compensators with the modification to the first SISO compensator and with the resulting output of the first SISO compensator can occur in real-time. The step of receiving an instruction to modify a parameter of a first SISO compensator of the plurality of distributed SISO compensators can include a user entering the instruction through a graphical user interface (GUI), and the GUI passing the instruction to the first SISO compensator for implementation.

In accordance with one embodiment of the present invention, in an electronic device, a method of manipulating a dynamic system representation having a plurality of distributed single input single output (SISO) compensators includes the step of modifying a parameter in a first SISO compensator of the plurality of distributed SISO compensators with a modification in accordance with an instruction. The first SISO compensator generates a resulting output. A remainder of the plurality of SISO compensators automatically update with the modification to the first SISO compensator and with the resulting output of the first SISO compensator contemporaneous with modification of the parameter and the first SISO compensator generating the resulting output. Outputs are displayed from the plurality of SISO compensators to the user.

In accordance with another embodiment of the present invention, an electronic device includes a dynamic system representation having a plurality of distributed single input single output (SISO) compensators. An interface is provided for instructing a modification to a parameter of a first SISO compensator of the plurality of distributed SISO compensators. An update mechanism automatically updates a remainder of the plurality of SISO compensators with the modification to the first SISO compensator and with a resulting output of the first SISO compensator contemporaneous with the modification to the parameter of the first SISO.

In accordance with aspects of the present invention, the device can further include a plurality of interfaces, such that there is at least one interface for each of the plurality of SISO compensators. The plurality of interfaces are of a type including at least one of a graphical editor instance and a text editor instance. The plurality of interfaces can include a first interface that is in communication with the first SISO compensator. The first interface executes the modification to modify the parameter.

In accordance with further aspects of the present invention, the interface can include an editing graphical user interface (GUI) displaying at least one of a plurality of editor instances for modifying parameters of the plurality of SISO compensators. The interface can also include a display graphical user interface (GUI) for displaying outputs generated by at least one of the plurality of SISO compensators. The interface can further include a configuration graphical user interface (GUI) for providing user access to a plurality of tools for refining a design of the dynamic system representation. The plurality of tools can include at least one of an open loop tool, a closed loop tool, a Bode plot tool, a Nichols plot tool, a root/locus tool, a discretization tool, and a tuning tool.

In accordance with a further aspect of the present invention, the update mechanism updates in real-time.

In accordance with another embodiment of the present invention, a medium holding computer executable steps for carrying out a method of manipulating a dynamic system representation having a plurality of distributed single input single output (SISO) compensators is provided. The method supported by the medium includes modifying the parameter in a first SISO compensator of the plurality of distributed SISO compensators with a modification in accordance with the instruction. The first SISO compensator operates to generate a resulting output. A remainder of the plurality of SISO compensators automatically updates with the modification to the first SISO compensator and with the resulting output of the first SISO compensator contemporaneous with the steps of modifying the parameter and operating the first SISO compensator.

BRIEF DESCRIPTION OF THE DRAWINGS

The present invention will become better understood with reference to the following description and accompanying drawings, wherein.

DETAILED DESCRIPTION

Figure 1:
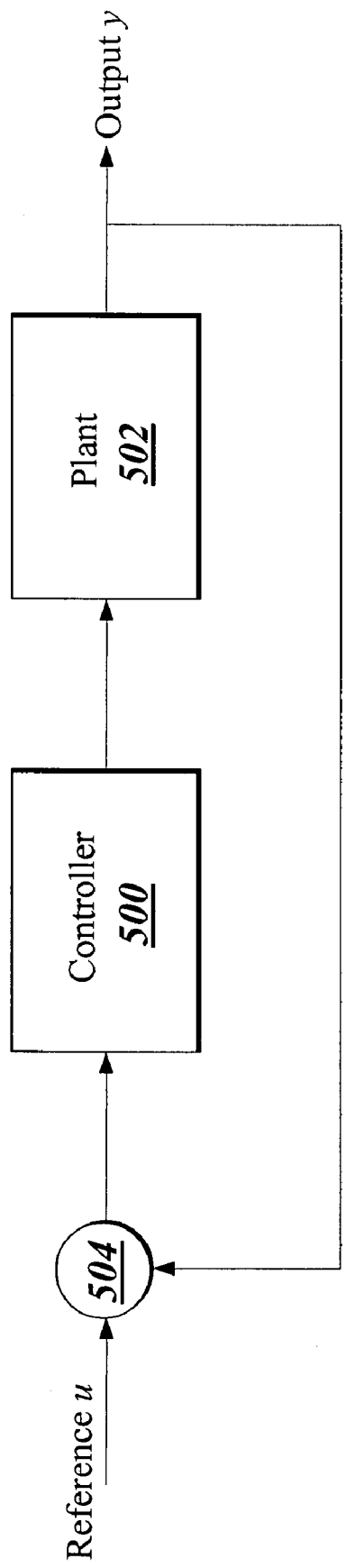
FIG. 1 is a diagrammatic illustration of an example conventional graphical model representation of a control system.

An illustrative embodiment of the present invention relates to a general framework for representing and manipulating linear time-invariant (LTI) control systems having a plurality of SISO feedback loops or, more generally, SISO "compensators" to be designed or tuned. The term compensator refers to any gain or dynamic system whose parameters are manipulated to enhance the performance of a control system. Systems having a plurality of SISO compensators are characterized as "Distributed SISO Control Systems" (DSCS). The present invention provides a graphical user interface (GUI) for interactively tuning design parameters and viewing resulting actions of the tuning actions across the larger DSCS. The GUI can include graphical interfaces, such as editors, which users can utilize to modify such variables as gain and other dynamics of each SISO compensator. Changes made to one SISO compensator generate different outputs, which are automatically translated to the other SISO compensators of the DSCS. There is a linking of interfaces and/or editors, such that changes made in one that affect another are automatically displayed accordingly. Such an arrangement provides for performance measuring views that provide real-time visual feedback on the effect of modified parameters on global performance. More specifically, the effects of changes in one compensator can be visualized in several different ways (time responses, frequency responses, system dynamics). Different configuration tools can be utilized in conjunction with the present invention to enable a user to experiment with different design scenarios and compare results. The present invention thus provides a Multi-Loop SISO Design Tool.

Moreover, the present invention multi-loop SISO design tool provides a flexible and efficient representation of (linear) DSCS that can accommodate arbitrary control structures and is well suited to fast numerical computations. The multi-loop SISO design tool is a specialized, high-performance computational engine that support real-time updating of the control system views through the use of caching and fast incremental updates. Furthermore, the multi-loop SISO design tool provides a suite of interactive graphical user interfaces for editing the tuned compensators and visually monitoring the impact of changes on all critical system responses.

FIGS. 3 through 12, wherein like parts are designated by like reference numerals throughout, illustrate an example embodiment of a DSCS design and analysis tool, according to the present invention. Although the present invention will be described with reference to the example embodiment illustrated in the figures, it should be understood that many alternative forms can embody the present invention. One of ordinary skill in the art will additionally appreciate different ways to alter the parameters of the embodiments disclosed in a manner still in keeping with the spirit and scope of the present invention.

There are a number of different types of control systems, some of which involve several single-input, single-output (SISO) regulation, or compensation, units. Such control systems are typically referred to as decentralized or distributed architectures, as opposed to multivariable control architectures where a single multi-input, multi-output control unit is used to control the entire system. Decentralized control architectures are ubiquitous in control applications, including use in simple cascaded loops, multi-axis, multi-loop aircraft, and/or missile autopilots, and the like.

Each regulation or compensation unit, collectively referred to as a "compensator," can be generally described as an algorithm that uses available real-time measurements of controlled variables to compute commands for driving various actuators (valves, motors, rudders, fins, and the like) in a control system.

As previously discussed, decentralized control systems are challenging to tune, and numerous domain-specific techniques have been devised. Most techniques involve sequential loop closure, which requires tuning one loop at a time. The sequential loop closure is then followed by a global performance assessment and tuning that attempts to adjust the entire set of compensators to achieve the desired overall performance. Each SISO loop is typically tuned using classical linear control techniques. The tuning process tends to be time consuming and require numerous iterations to build sufficient insight into the design tradeoffs. The present invention provides an interactive visual or graphical environment that accelerates the discovery of control system responses to varied inputs, and provides quick insight into the incremental effect of parameter changes on the overall design.

Figure 3:
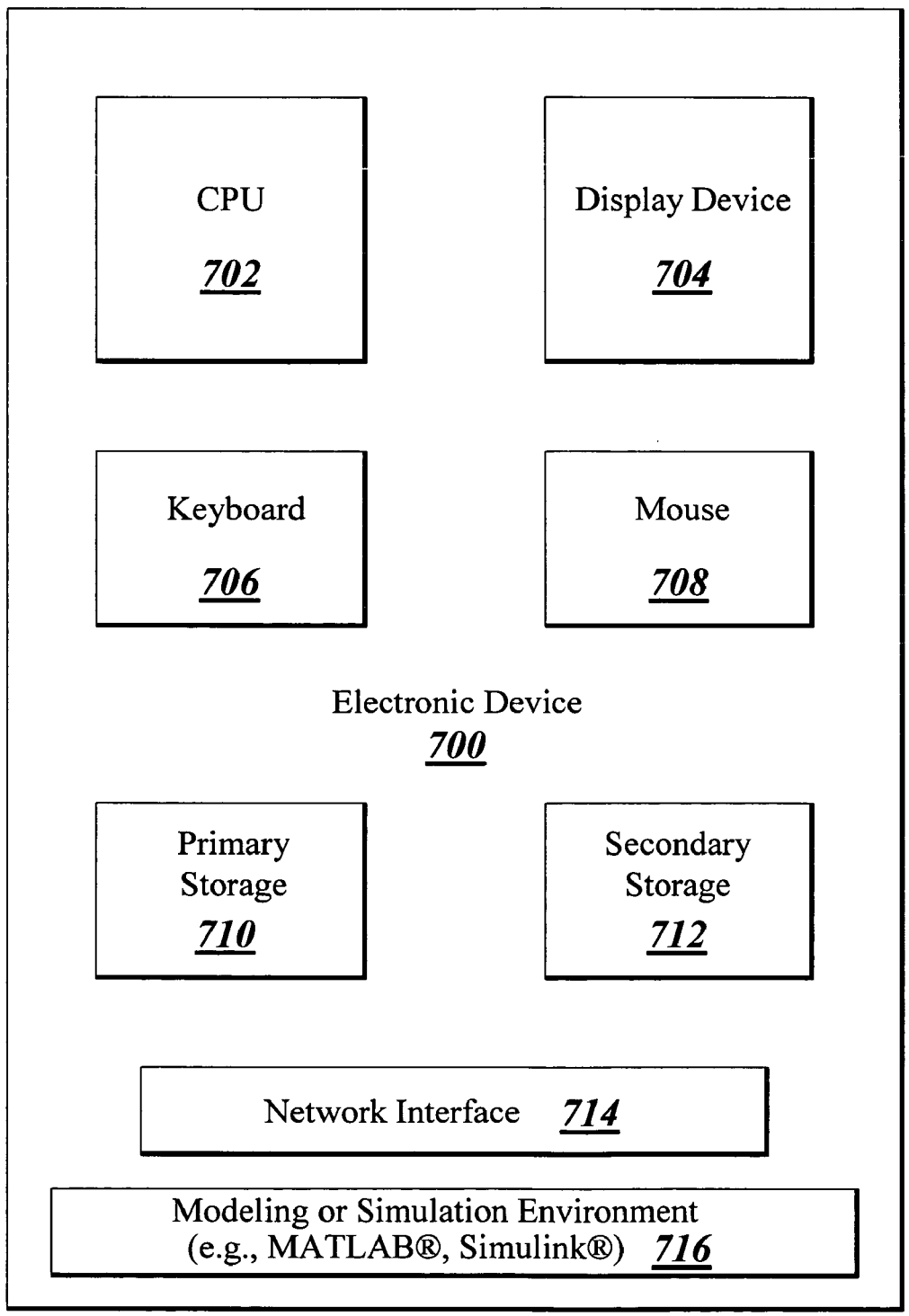
FIG. 3 is a diagrammatic illustration of an electronic device for use in implementing the present invention.

The present invention can be implemented on an electronic device. FIG. 3 illustrates one example embodiment of an electronic device 700 suitable for practicing the illustrative embodiments of the present invention. The electronic device 700 is representative of a number of different technologies, such as personal computers (PCs), laptop computers, workstations, personal digital assistants (PDAs), Internet appliances, cellular telephones, wireless devices, and the like. In the illustrated embodiment, the electronic device 700 includes a central processing unit (CPU) 702 and a display device 704. The display device 704 enables the electronic device 700 to communicate directly with a user through a visual display. The electronic device 700 further includes a keyboard 706 and a mouse 708. Other potential input devices not depicted include a stylus, trackball, joystick, touch pad, touch screen, and the like. The electronic device 700 includes primary storage device 710 and secondary storage device 712 for storing data and instructions. The primary and secondary storage devices 710 and 712 can include, but are not limited to, such technologies as a floppy drive, hard drive, tape drive, optical drive, read only memory (ROM), random access memory (RAM), and the like. Applications such as browsers, JAVA virtual machines, C compilers, and other utilities and applications can be resident on one or both of the primary and secondary storage devices 710 and 712. The electronic device 700 can also include a network interface 714 for communicating with one or more electronic devices external to the electronic device 700 depicted. Modems and Ethernet cards, are examples of network interfaces 714 for establishing a connection with an external electronic device or network. The CPU 712 has either internally, or externally, attached thereto one or more of the aforementioned components. In addition to applications previously mentioned, simulation and/or modeling applications 716, such as MATLAB®, or Simulink®, can be installed and operated on the electronic device 700.

It should be noted that the electronic device 700 is merely representative of a structure for implementing the present invention. However, one of ordinary skill in the art will appreciate that the present invention is not limited to implementation on only the described device 700. Other implementations can be utilized, including an implementation based partially or entirely in embedded code, where no user inputs or display devices are necessary. In such an instance, a processor can communicate directly with another processor, or other device.

There are many different decentralized control architectures. A first approach for representing the decentralized control architectures in a general, scalable, and efficient representation is called a "lumped representation".

Figure 4:
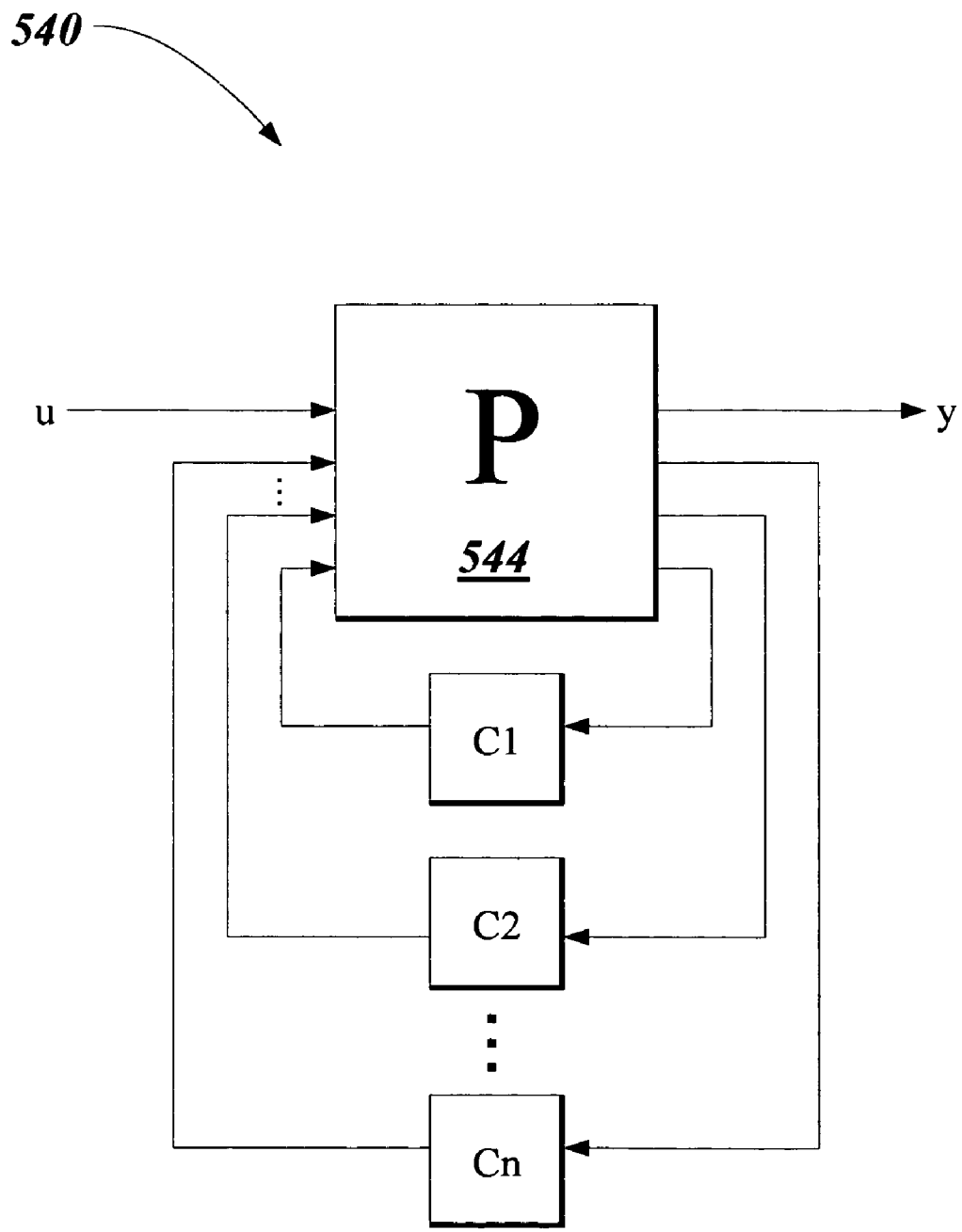
FIG. 4 is a diagrammatic illustration of a lumped representation of a DSCS, in accordance with one aspect of the present invention.

FIG. 4 is a diagrammatic illustration of a lumped representation 540 of a DSCS. This approach lumps all known components into a multi-input, multi-output (MIMO) model P, further referenced as a lumped plant model 544. The lumped plant model 544 connects to a set of tunable controllers $C_1, \ldots, C_n$. The set of tunable controllers $C_1, \ldots C_n$ receive output from the lumped plant model 544, perform some controlling operation, and provide resulting feedback to the lumped plant model 544. In addition, the lumped plant model 544 has further input/output (I/O) channels u and y, which include all external inputs u and performance-related outputs y to the DSCS.

Any graphical model representing a DSCS with tunable LTI components can be transformed into the illustrated format. The transformation can be performed by hand for common architectures involving fewer blocks, and automated for more complex graphical models using, e.g., linearization techniques for graphical models. Furthermore, other graphical representations known to those of ordinary skill in the art that represent a plant with a plurality of controllers and different inputs and outputs can be modeled in the illustrated format. Furthermore, one of ordinary skill in the art will appreciate that the actual arrangement of the various components of FIG. 4, and the actual format used in displaying the DSCS can vary.

In the context of the example software application MATLAB®, a linearization tool can be utilized to create the lumped representation and a later described expanded representation. Generally, the linearization tool uses exact small signal linearization or large signal linearization tools such as black box models and describing functions to automatically extract a linear model at specified operating conditions. These linear models relate the effect of reference and disturbance input changes on the response of the control system. The linearization tool is known to those of ordinary skill in the art, and can have many different forms.

The purpose of the lumped representation 540 is generally to take a DSCS and simplify the representation of the DSCS into a single MIMO point of execution. Thus, any method or format of representing the DCSC in a single MIMO point of execution can be implemented in accordance with the present invention, and the present invention is not limited to the illustrative format of FIG. 4.

Figure 5:
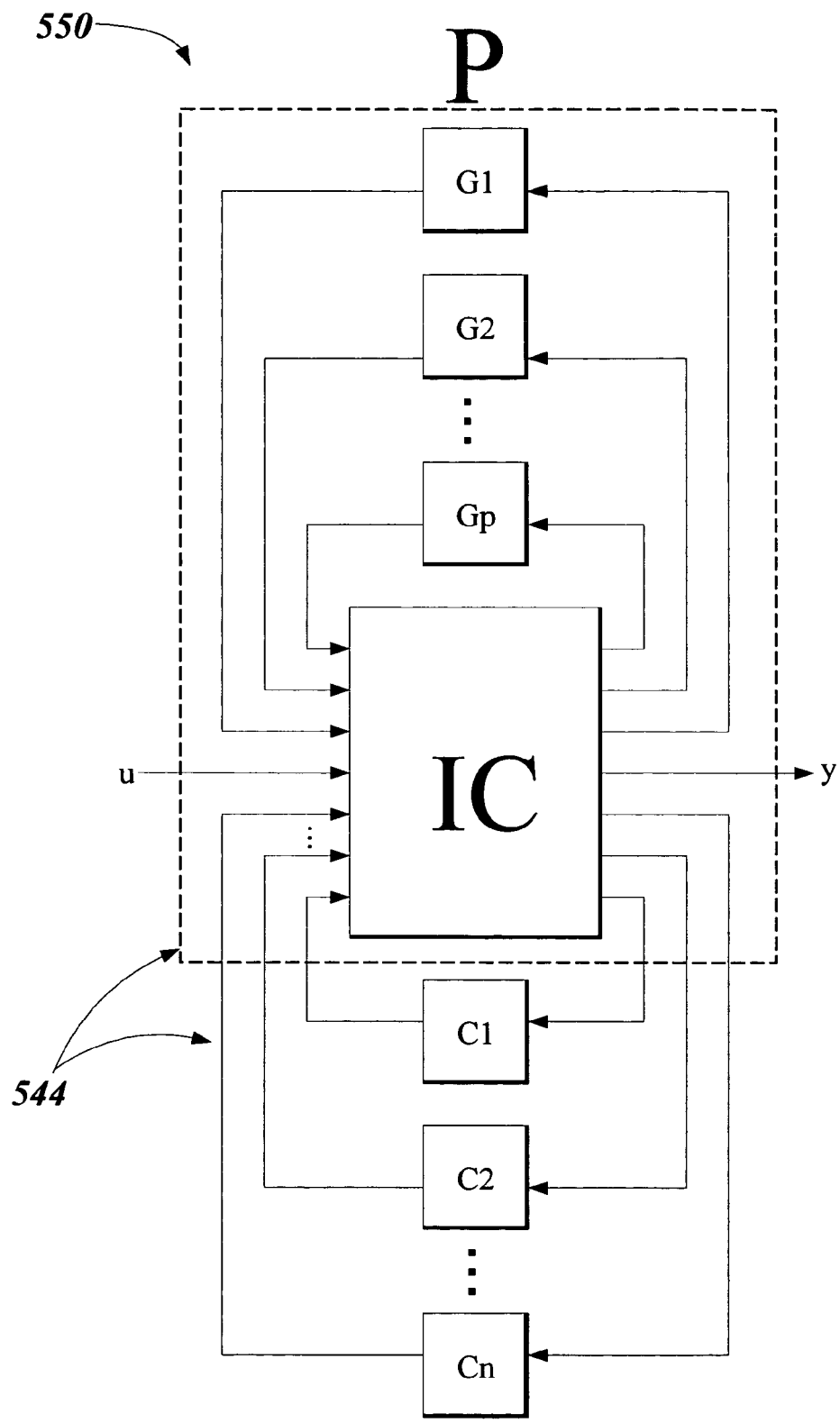
FIG. 5 is a diagrammatic illustration of, an expanded representation of the DSCS, in accordance with one aspect of the present invention.

In accordance with another example embodiment of the present invention, a second approach for representing the decentralized control architectures in a general, scalable, and efficient representation is called an "expanded representation" 550, as shown in FIG. 5. The expanded representation 550 further breaks down the lumped plant model 544 into an interconnection matrix IC, having Boolean entries. The Boolean entries are connected to a set of plant components $G_1, \ldots, G_p$), for which an LTI model is assumed to be available. There are, as described before, the tunable controllers $C_1, \ldots, C_n$ that receive output from the lumped plant model 544 and provide feedback to the lumped plant model 544. The output (I/O) channels u and y include all external inputs u and performance-related outputs y to the DSCS. This second example embodiment preserves the plant structure and accelerates the extraction of the various open-loop transfer functions used for tuning individual compensators.

The lumped representation 540 and the further detailed expanded representation 550 provide a structure that enables efficient algorithms for extracting the minimal set of components (dynamics) that enter in a given feedback loop from such representations. Furthermore, efficient state-space algorithms are available in computer packages, such as MATLAB®, provided by The Mathworks, Inc. of Natick, Mass., for manipulating such representations and deriving the necessary time and frequency responses.

In addition to deploying linear control design techniques, the lumped representation 540 and the expanded representation 550 can be readily extended to support any nonlinear technique amenable to interactive tuning of design parameters. In addition, the lumped representation 540 and the expanded representation 550 are applicable to any decentralized control system, not just DSCS systems with SISO components, as would be understood by one of ordinary skill in the art.

Figure 6:
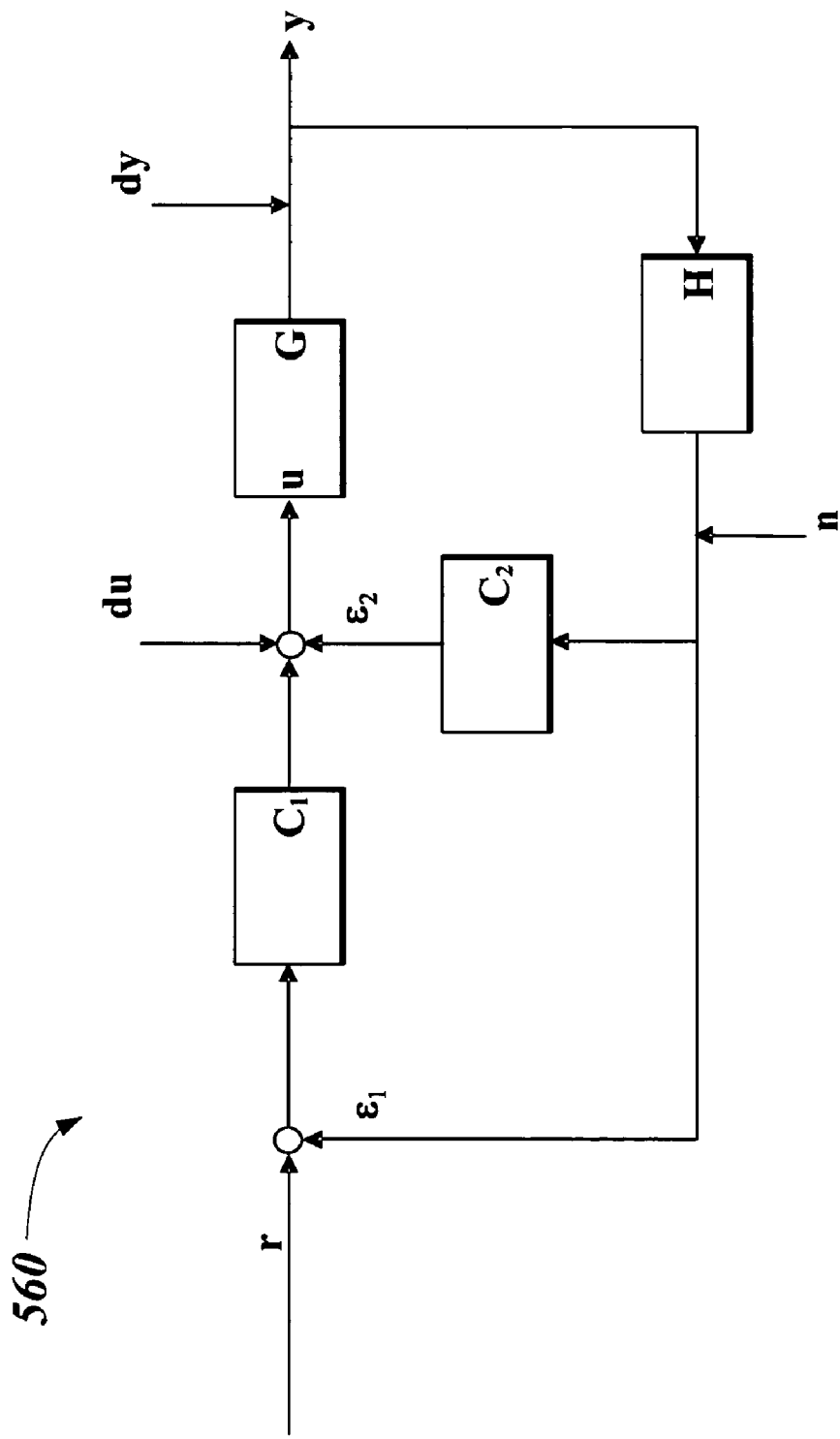
FIG. 6 is a diagrammatic illustration of a two-degree-of-freedom architecture, in accordance with one aspect of the present invention.

Calculations can be performed to construct the expanded representation 550 of FIG. 5 for individual control architectures. For example, FIG. 6 is a diagrammatic illustration of a two-degree-of-freedom architecture 560, where external inputs are r, du, dy, and n, and performance outputs are y and u. Controllers C1 and C2 provide locations for control system parameters to be designated and system performance to be tracked. The controllers C1 and C2 received inputs and feedback, both external and internal to the DSCS being modeled or represented. Additional task execution blocks "g" and "h" represent different functions or operations performed by the DSCS.

Task execution blocks "g" and "h" have inputs and outputs, which can be represented by variables $g_{in}$, $g_{out}$, $h_{in}$, and $h_{out}$, respectively. The variables $g_{in}$, $g_{out}$, $h_{in}$, and $h_{out}$ denote the signals coming in and out of the g block and h block. Such representations would be similar for other task blocks in the dynamic system. According to the expanded representation 550 format, the interconnection matrix IC is derived from the signal connectivity equation as follows:

$$\begin{bmatrix} g_{in} \\ h_{in} \\ \hline y \\ u \\ \hline C_{1in} \\ C_{2in} \end{bmatrix} = \underbrace{\begin{bmatrix} 0 & 0 & 0 & 0 & 1 & 0 & 1 & \varepsilon_2 \\ 1 & 0 & 0 & 1 & 0 & 0 & 0 & 0 \\ \hline 1 & 0 & 0 & 1 & 0 & 0 & 0 & 0 \\ 0 & 0 & 0 & 0 & 1 & 0 & 1 & \varepsilon_2 \\ \hline 0 & \varepsilon_1 & 1 & 0 & 0 & \varepsilon_1 & 0 & 0 \\ 0 & 1 & 0 & 0 & 0 & 1 & 0 & 0 \end{bmatrix}}_{IC} \begin{bmatrix} g_{out} \\ h_{out} \\ r \\ dy \\ du \\ n \\ C_{1out} \\ C_{out2} \end{bmatrix}$$

Figure 7:
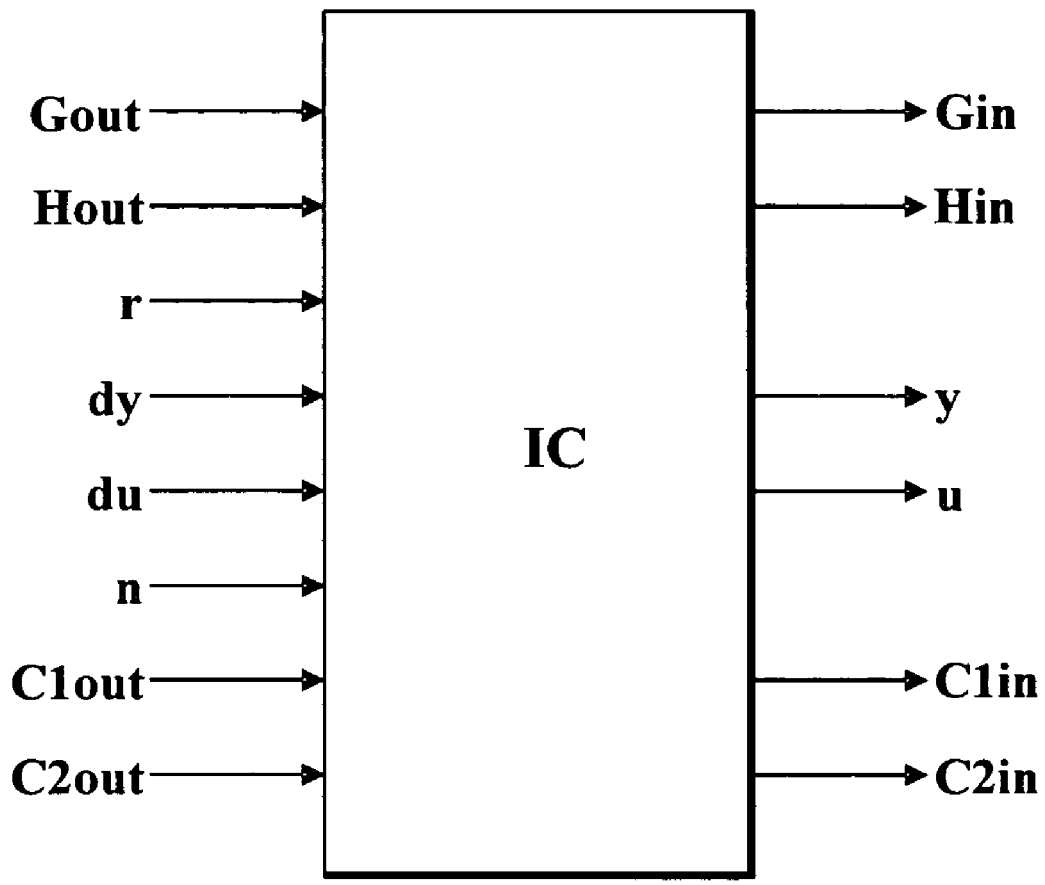
FIG. 7 is a diagrammatic illustration of the two-degree-of-freedom architecture as translated by a signal connectivity equation, in accordance with one aspect of the present invention.

In addition, the signal connectivity equation above can be further represented as in FIG. 7, which shows how the block outputs $g_{out}$, $h_{out}$, $C1_{out}$, $C2_{out}$ and the external inputs r, dy, du, n pass through the interconnection matrix IC to generate the block inputs $g_{in}$, $h_{in}$, $C1_{in}$, and $C2_{in}$ and external outputs y, u. Further, from this description of the control structure, it is possible to compute all point-to-point open-loop and closed-loop responses, as well as efficiently update these responses when modifying a particular SISO compensator C $C_j$.

Figure 8:
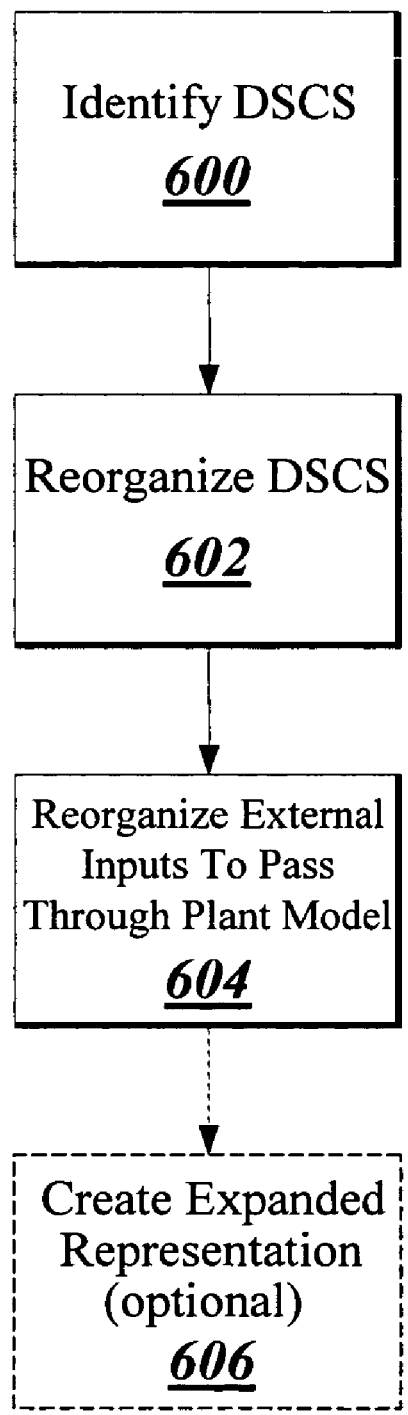
FIG. 8 is a flowchart illustrating a method for translating a given DSCS into a single connectivity equation as represented in FIG. 7, according to one aspect of the present invention.

FIG. 8 illustrates a general method for translating a given DSCS into a single connectivity equation as shown above and illustrated in FIG. 7. A DSCS is provided for conversion (step 600). The DSCS is reorganized through the known process of linearization to pass all controller modules and DSCS functions through a single plant model (step 602). All external inputs are further passed through the single plant model (604) to complete the transformation to the lumped representation 540. As an alternative, the method can continue with creation of the expanded representation 550. The single plant model is further analyzed and expanded (step 606) to create the expanded representation 550.

Figure 2:
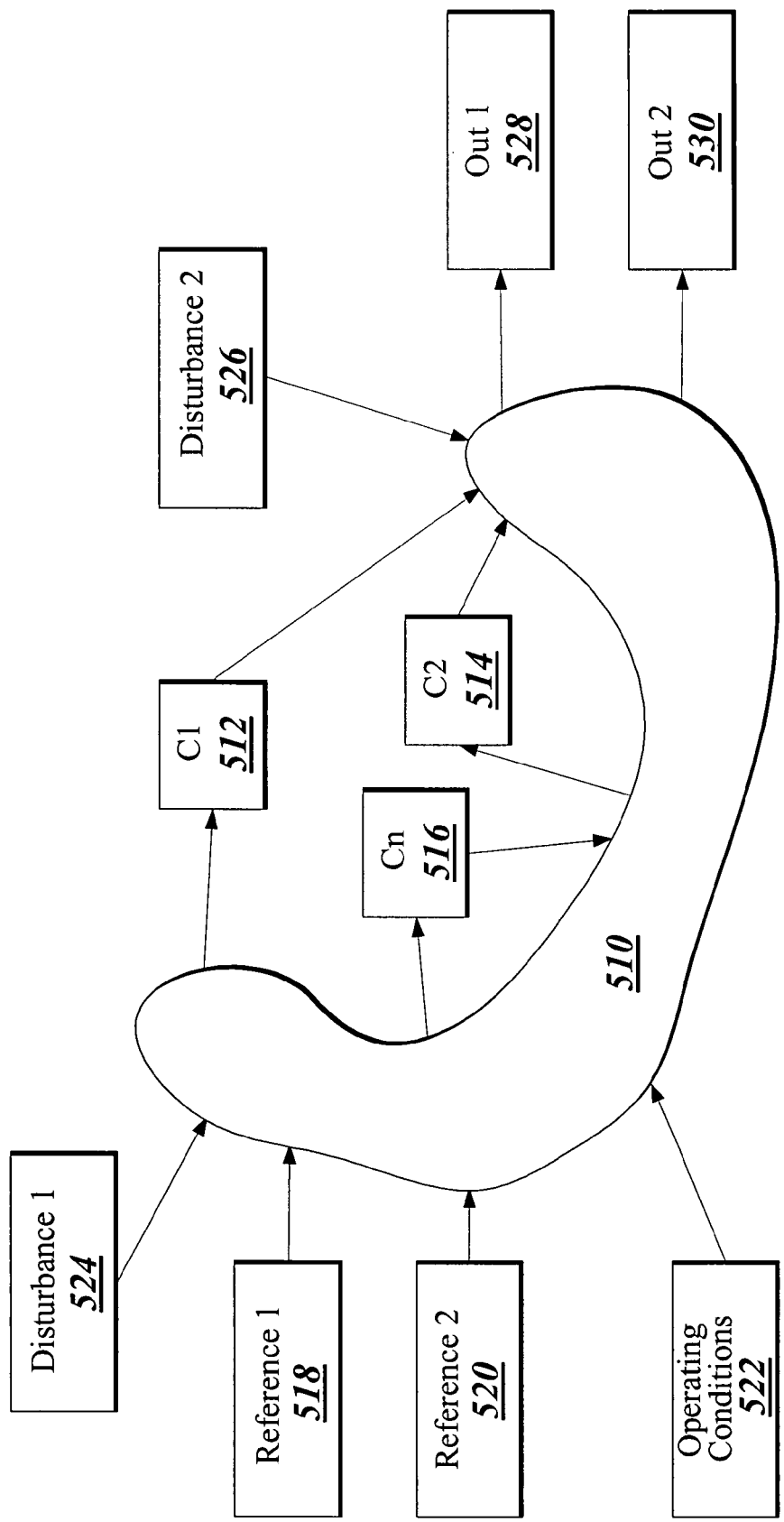
FIG. 2 is a diagrammatic illustration of an example complex control system.

An illustrative example of the above-described method for translating a DSCS into a single equation as shown in FIG. 8 is provided as follows, using the example system of FIG. 2. The DSCS shown in FIG. 2 can be re-organized to a set of single connectivity equations through a process known as linearization (as described in step 602 above). The process of performing a linearization involves the identification of the following components of the system in FIG. 2. First, the operating conditions of a physical model define its total "state" at any given time. For example, for a model of a car engine, the operating conditions are typically described by variables such as engine speed, throttle angle, engine temperature, and the surrounding atmospheric condition. The behavior, or the "dynamics", of the model are generally affected by the levels of the operating conditions. For example, in a car, the behavior of an engine can greatly vary if the car operates in the high elevations of Colorado verses the low elevations of Florida. The specification of operating conditions is typically dependent on the medium that the DSCS is described.

The reference signals (first reference 518 and second reference 520) are known input signals. Often these are step functions or sinusoidal signals. The first step in developing intuitions about a plant or its model is to input a known signal and view the output. Disturbances, often called exogenous disturbances, are events that interact with a dynamical system, but are not part of the plant or inputs to the system. These signals are known as linearization inputs, and are input at the point of each of the other inputs to the DSCS.

Compensators (controllers 512, 514, and 516) are dynamical systems specifically designed to change the behavior of plants so that certain performance criteria are achieved. For each compensator there are linearization inputs identified and linearization outputs that need to be identified. Additionally, loop openings must be identified. What this means is that that any path through the compensators will be eliminated.

Outputs (first output 528 and second output 530) are the output signals of the system. Control engineers can use feedback of output signals—feeding the outputs back in as inputs—to help stabilize and control plants. Also, measurements of output signals help engineers determine if their designs meet specifications.

Once these components are identified the DSCS can be linearized. Many linearization tools support the specification of linearization inputs, outputs, loop openings, and operating conditions and their implementation is application specific. The resulting linear model will be of the form in FIG. 4.

Figure 9:
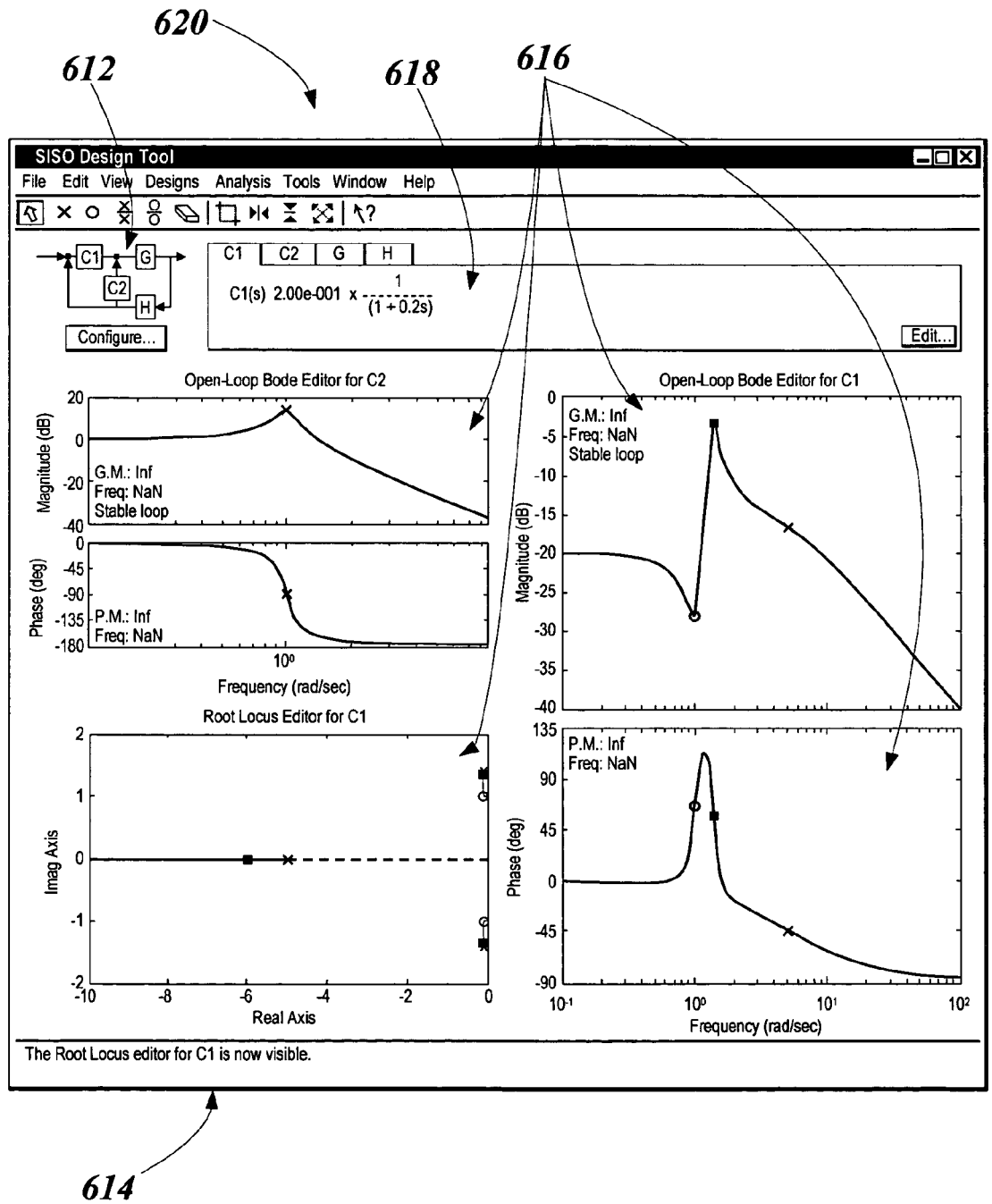
FIG. 9 is screen representation of a design tool GUI, in accordance with one embodiment of the present invention.

A design tool GUI 620 enables execution of additional features of the present invention. The design tool GUI 620 enables designing and tuning of the DSCS, and makes use of the above-discussed lumped representation 540 and expanded representation 550 of the DSCS to carry out the desired design and tuning work. FIG. 9 illustrates the design tool GUI 620. The design tool GUI 620 can have a number of different layouts and can provide a number of different types of information. The following description is merely representative of one example embodiment of the design tool GUI 620.

The design tool GUI 620 can have a sketch 612 of the DSCS being designed. In the example illustration, a two-loop control system with compensators C1 and C2 is shown.

A design interface 614 provides a user or other system with access to the different inputs of the compensators C1 and C2 of the DSCS. For example, the design interface 614, in the present example, includes a graphical editor 616 where users can edit the gain and dynamics of individual compensators C1 and C2, shown in the sketch 612. The graphical editor 616 shows such items as standard plots for analyzing and tuning control systems. The standard plots and tools that can be displayed include, but are not limited to, root locus plots, open-loop Bode diagrams, open-loop Nichols charts, a closed loop plot, a discretization tool, a tuning tool, and other tuning parameters as known to those of ordinary skill in the art and as would be considered useful in analysis, design, and tuning of the DSCS.

The editing function of the graphical editor 616 is carried out by, for example, using a mouse to click on a particular pole or value shown on one of the charts or plots, and dragging that pole or variable value to a desired location. All plots and charts of the graphical editor 616 update in real time while the user drags the pole or variable value, providing instant feedback into how the pole location or variable value affects the overall DSCS performance. Users can also add or remove compensator C1 and C2 dynamics using the graphical editor 616, such as through the tool bar or pull-down menus.

A text editor 618 enables access by the user or another system to edit numerical values of, for example, gain and other dynamics of the individual compensators C1 and C2. The editing function of the text editor 618 is carried out by, for example, using a mouse or keyboard to identify a particular variable or dynamic operation of one of the compensators C1 and C2, and then entering a desired value using the keyboard or other input device.

Figure 10:
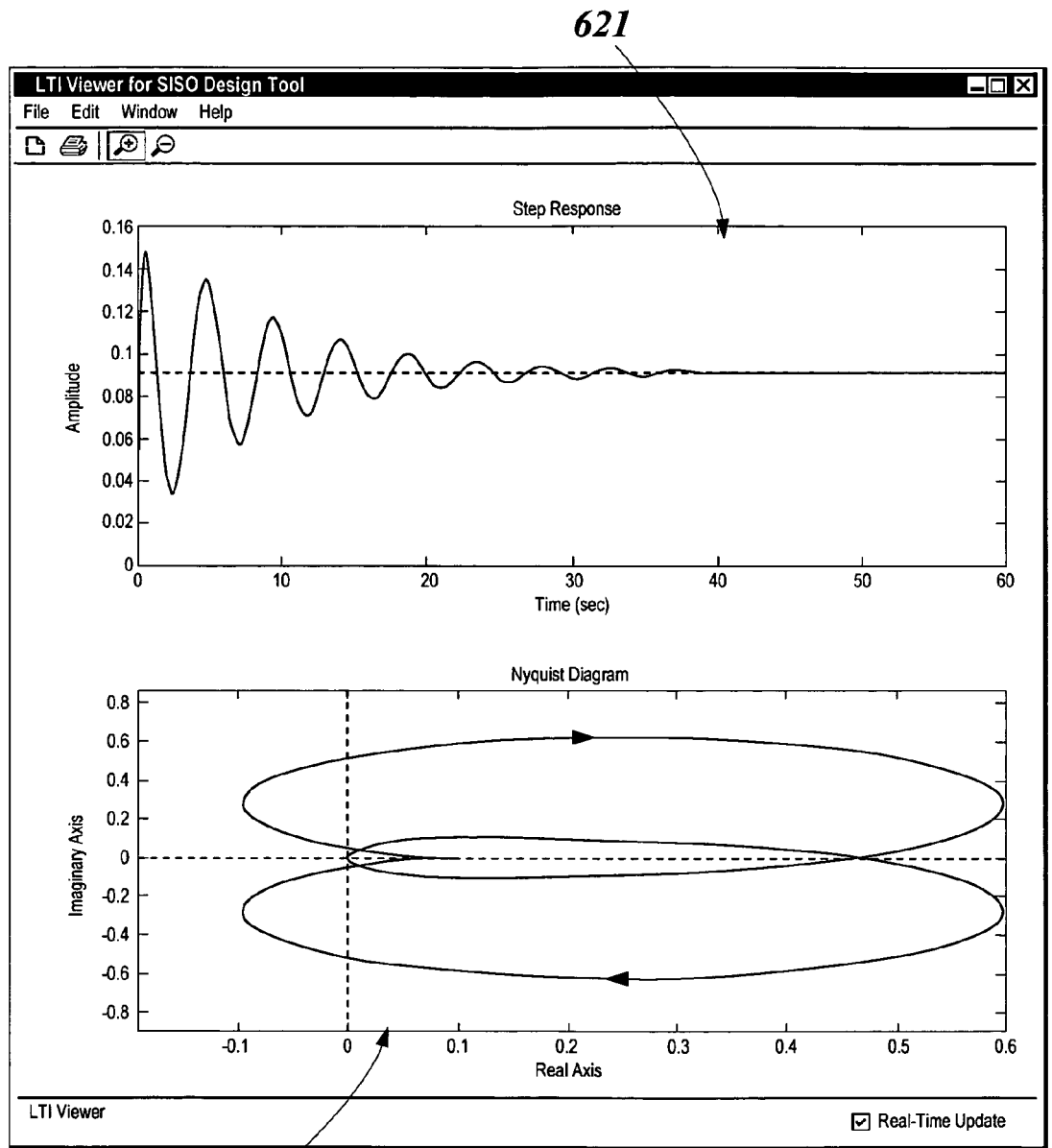
FIG. 10 is a screen representation of configurable views of DSCS responses, in accordance with one embodiment of the present invention.

The design interface 614 can provide additional views to convey different information as well. For example, FIG. 10 shows configurable views 621 and 622 of the DSCS responses, including responses of any components (plant or compensator), open-loop responses, and point-to-point closed-loop responses. A user can specify different views of different variables, as desired, to track the responses of any of the DSCS components as changes are made to the values in the compensators C1 and C2. Furthermore, for a MIMO design, having multiple compensators (such as compensators C1 and C2), the user can view each of the multiple compensators at the same time. The user can further tune one loop of one compensator with the other compensator loop(s) closed, or open, to see different results of changes in gain or dynamics of the compensator (C1 or C2) being manipulated. This arrangement and ability is an improvement over previous known methods of opening a single window at a time for each compensator, and making changes to that compensator. Such changes would not translate through to the other compensators of the DSCS, until relinearization was carried out on the entire system. As such, the user would not be able to see, in real time, the effect of changes to a compensator to the remainder of the DSCS. Contrarily, the present invention provides the user with the ability to make changes to the values of a compensator (such as compensator C1 or C2) and in real-time see the results across the remainder of the DSCS, or the results of specified other compensators or DSCS components.

Figure 11:
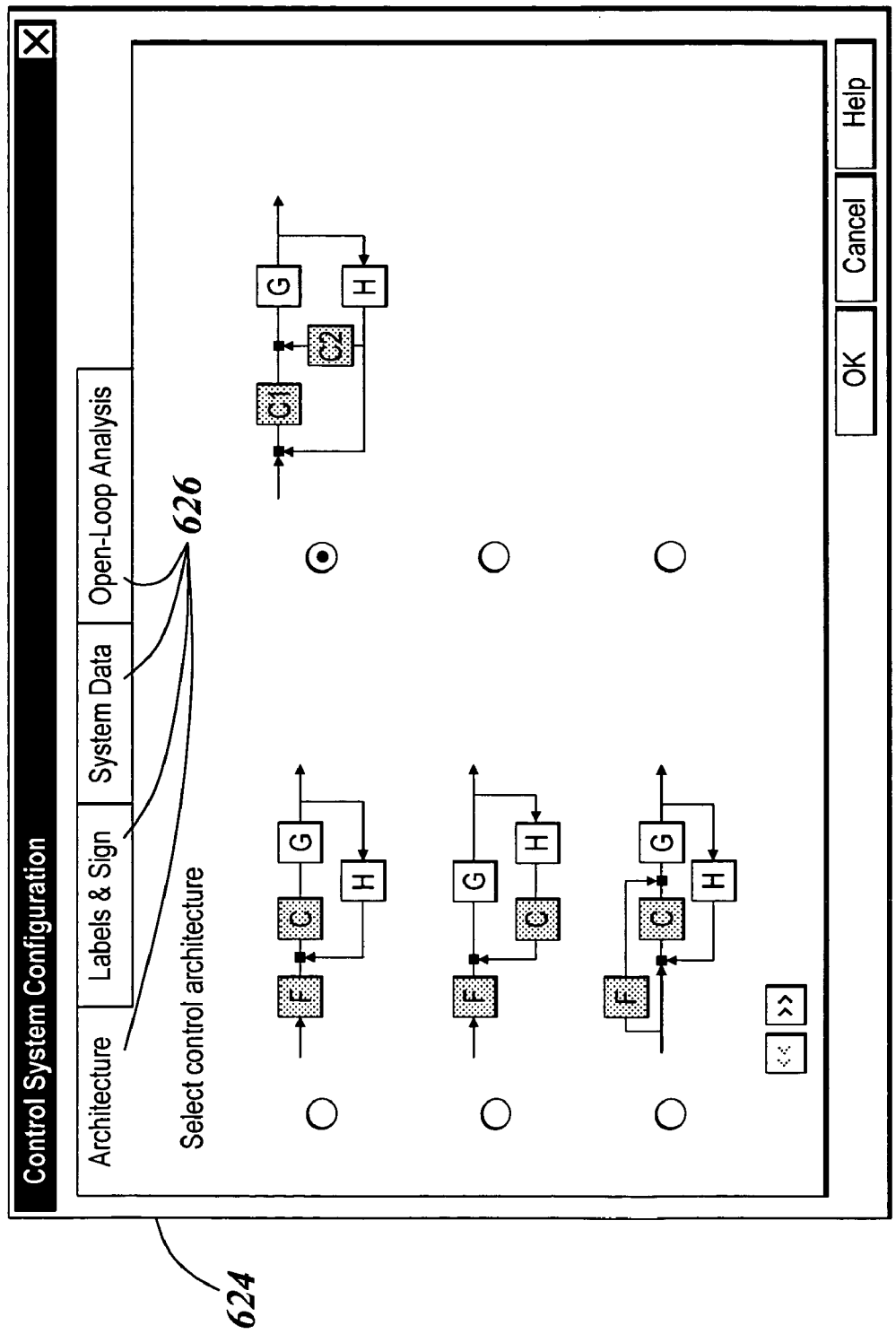
FIG. 11 is a screen depiction of a tabbed panel for accessing different functions of the design tool GUI, in accordance with one embodiment of the present invention.

FIG. 11 shows a tabbed panel 624. The tabbed panel 624 displays the transfer function of each component of the DSCS. Applications, such as MATLAB®, have a catalog or library of control architecture configurations. As such, a user can access the tabbed panel 624 and select a particular control architecture for use in the DSCS. A selection of tabs 626 provide the user with direct access to other features of the design interface 614, such as Labels & Signs, System Data, and Open-Loop Analysis, were the above discussed functions of the design interface 614 are provided. The user can, for example, select control architecture, configure the system for open loop analysis, import data, export data, and the like. Discretization tools, known to those of ordinary skill in the art, are also accessible to facilitate the implementation of the compensators on digital computers and embedded systems.

To build an interactive tool, such as the design interface 614 of FIG. 9, where all views update in real time when continuously varying some design parameters, it is desirable to minimize the incremental amount of computation needed to update loop responses shown in the various graphical views.

The present invention provides custom data structures and algorithms for implementation to achieve the desired level of performance. One of ordinary skill in the art will appreciate that such custom data structures and algorithms can vary, depending on the particular programming approach utilized, and that the present invention is not limited to such specific data structures and algorithms. Thus, the following description is provided to enable one of ordinary skill in the art to prepare the desired data structures and algorithms accordingly.

Figure 12:
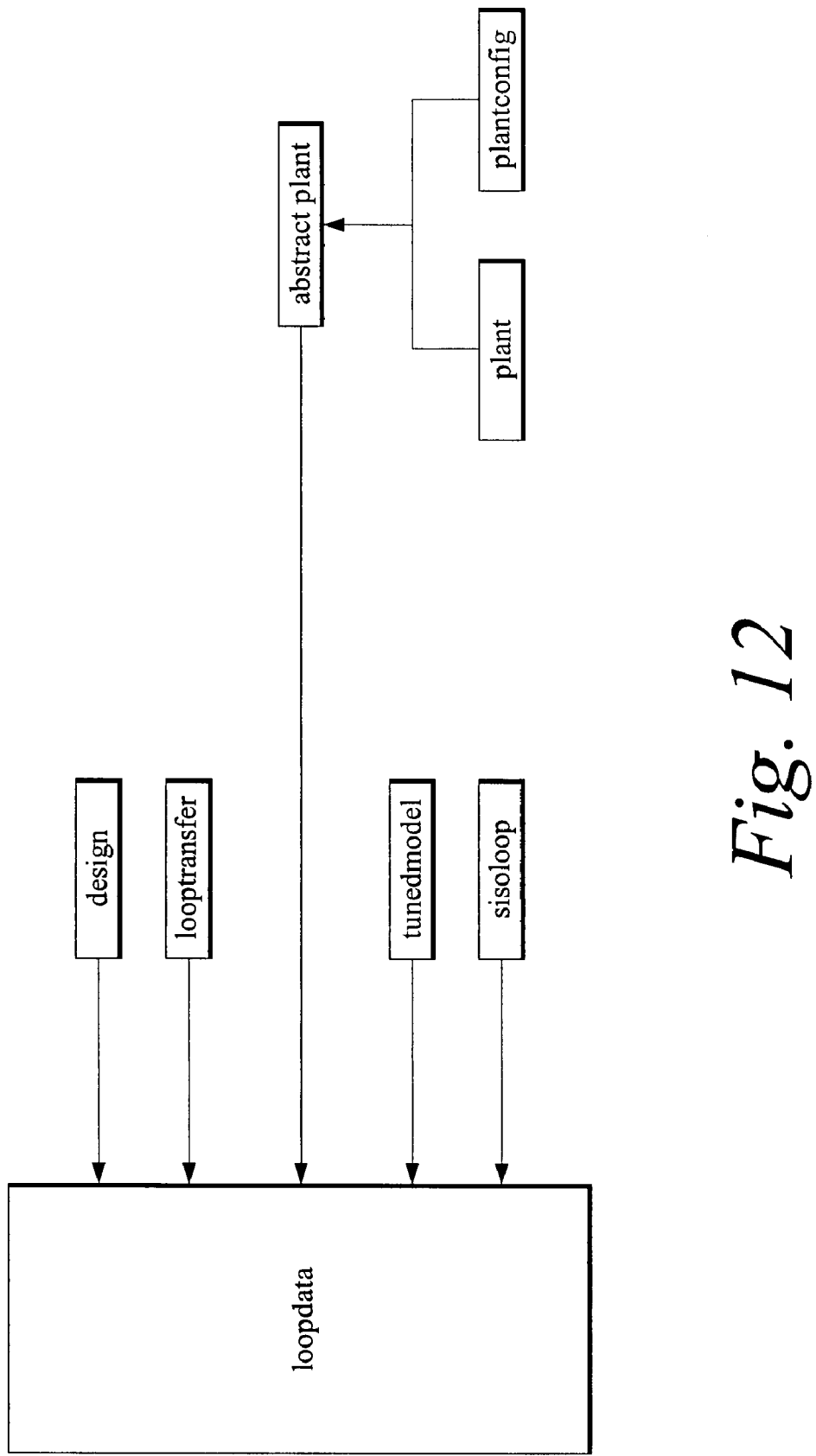
FIG. 12 is a diagrammatic illustration of a data model for implementing the design tool GUI of the present invention.

The data structures and algorithms occur in a data model, an example of which is shown in FIG. 12. Generally, the algorithms make extensive use of caching and on-demand computation. The algorithms utilized for analyzing the structure of the DSCS architecture and extracting the portion relevant to a particular SISO loop are crafted to be as efficient as possible. Further, there is construction of the appropriate reduced sub-problems to speed up computations during mouse-driven editing of design parameters.

More specifically, consider the generic distributed architecture of FIG. 6, where each tuned compensator Cj is of the form:

$$C_j(s) = k \frac{(s-z_1) \ldots (s-z_m)}{(s-p_1) \ldots (s-p_n)}$$

The present invention provides the ability to graphically modify compensator parameters by selecting and dragging graphical objects that embody these parameters. For example, a user may select the magnitude curve in the open-loop response view and move it up and down with the mouse as a way of changing the value of the compensator gain k. To provide real-time feedback on the effect of such modifications, it is critical to minimize the incremental amount of computation needed to update the open- and closed-loop views of interest.

In general, users can modify parameters of the compensators Cj, such as Gain value k, and location of a particular subset S of the compensator poles $p_k$ and zeros $z_k$. Internally, the mouse locations during a select-and-drag operation are sampled and converted into a discrete set of values $x_1, \ldots, x_N$ for the modified compensator. For each new value, the currently visible open-loop and closed-loop views must be updated to provide visual feedback on how the modified parameter impacts the control system behavior.

Point-to-point transfer functions and responses of interest include open-loop response for the modified compensator $C_j$, defined as the transfer function $L_j = P_j C_j$ where $P_j$ is the plant model seen by the compensator, or the transfer function from the compensator output to the compensator input with the loop opened at the compensator output. In many cases, only the frequency response and the root locus of $L_j$ are of interest Point-to-point transfer functions and responses of interest also include open-loop responses for the remaining compensators $C_i$, defined as the transfer functions $L_i = P_i(C_j)C_i$, $i \neq j$ where $C_i$ is fixed and $P_i(C_j)$ is the plant seen by $C_i$, which itself may depend on the modified compensator $C_j$ Point-to-point transfer functions and responses of interest further include point-to-point closed-loop response from any external input $u_j$ to any external output $y_i$ in FIG. 4.

The following algorithms have been devised to speed up the incremental amount of computation needed to perform the three tasks above. For the open-loop response of the modified compensator $C_j$, a structurally minimal realization state-space model of $P_j$ is extracted from the LFT model of FIG. 4 using structural reduction algorithms equivalent to, for example, SMINREAL provided in the Control System Toolbox offered by The Mathworks, Inc. For frequency response computation, the frequency response of $P_j$ and of the fixed part of $C_j$ are pre-computed, reducing the incremental update burden to just factoring in the contribution of the modified part of $C_j$, which is typically low-order and therefore inexpensive to compute. For root locus computation, the state matrix $A_{cl}$ of the system obtained by closing the $L_i$ loop is assembled from the state-space models of $P_j$ and the fixed part of $C_1$, together with the low-order state-space realization of the modified portion of $C_j$, which must be recomputed for each update. The poles of $A_{cl}$ are then computed for a fixed set of gains (typically, last set of gains generated by full update) and used to update the root locus plot.

For the open-loop response of the remaining compensators $C_i$, the transfer function $L_i$ is parameterized as $L_i = LFT(H, \hat{C}_j)$ where H is an appropriate state-space model including all fixed dynamics, $\hat{C}_j$ is the modified part of the compensator $C_j$, and LFT is the standard linear fractional transformation. Using this representation, a state-space model of $L_i$ can be quickly assembled and used to update the root locus as explained above. Similarly, the frequency response of H can be pre-computed over some predetermined grid so that the frequency response of $L_i$ for each updated parameter $x_n$ can be evaluated in $o(N_f)$ where $N_f$ is the number of frequency grid points. It should be noted that structural reduction algorithms equivalent to SMINREAL can be used to efficiently and reliably detect when $P_i(C_j)$ does not depend on the modified compensator $C_j$ at all (due to the control structure), in which case $L_i$ is not updated.

Any point-to-point closed-loop response can be parameterized as $T = LFT(H, \hat{C}_j)$ where H is an appropriate state-space model including all fixed dynamics, $\hat{C}_j$ is the modified part of the compensator $C_j$, and LFT is the standard linear fractional transformation. Using this parameterization, the state-space model of T can be quickly updated and used to simulate the closed-loop time responses. As for the frequency response of T, it can be updated in $o(N_f)$ by again pre-computing the frequency response of H over some predetermined frequency grid and folding in the response of $\hat{C}_j$ over the same grid at each update point.

Main components, or classes, in the data method include the following classes. A "loopdata" class manages the various components of the data model and is responsible for computing and providing the various open-loop and closed-loop transfer functions used for design and performance analysis.

A "tunedmodel" class implements the notion of tuned component or compensator. Each SISO compensator is represented as a zero/pole/gain model, the poles and zeros being divided into groups such as real, complex, lean, lag, or notch elements to facilitate their graphical manipulation.

A "plant" class and a "plantconfig" class implement the notion of plant in the lumped representation, or the expanded representation formats and can be descendants of an "abstract plant" class. The "plant" class specifies the lumped plant model P as a state-space model, and also caches its zero/pole/gain representation to speed up frequency response computations. The "plantconfig" class stores the interconnection matrix IC along with LTI models for each SISO component $G_i$. Both the "plant" class and the "plantconfig" class are responsible for maintaining the list of compensators on which a particular SISO loop depends. This information is obtained by connectivity analysis and helps determine which design views need updating when a particular compensator is modified.

A "sisoloop" class manages and analyzes individual SISO loops. The "sisoloop" class is responsible for deriving the open-loop model associated with each SISO compensator with feedback effect.

Additional classes are used to store intermediate designs ("design" class) and define what point-to-point transfer functions are of interest for performance analysis ("looptransfer" class).

The present invention, thus, provides model-based tuning of arbitrary linear DSCS. Users specify their control architecture along with linear models for the plant components, including sensor and actuator models, and can start tuning the control algorithms in the form of compensators using a variety of classical techniques. Some of the techniques available to the user include root locus, Bode diagrams, Nichols chart, and other parameter analysis methods. The present invention is also useful for design and tuning of nonlinear control systems using the conventional procedure of linearizing the plant around specific operating points or set points, designing linear compensators for the linearized dynamics, and tabulating and scheduling the linear compensators across the operating envelope.

As understood by one of ordinary skill in the art, the present invention can be used in conjunction with graphical editors, such as the graphical model editor Simulink®, to specify and handle arbitrary DSCS architectures. In this context, users designate the compensator blocks to be tuned, and the Simulink® linearization engine is used to automatically construct the lumped DSCS representation. The invention can then be used to tune the designated blocks and automatically upload the tuned values in the graphical model for further analysis and nonlinear simulations.

Numerous modifications and alternative embodiments of the present invention will be apparent to those skilled in the art in view of the foregoing description. Accordingly, this description is to be construed as illustrative only and is for the purpose of teaching those skilled in the art the best mode for carrying out the present invention. Details of the structure may vary substantially without departing from the spirit of the invention, and exclusive use of all modifications that come within the scope of the appended claims is reserved. It is intended that the present invention be limited only to the extent required by the appended claims and the applicable rules of law.

What is claimed is:

1. In an electronic device, a method of manipulating a control system representation having a plurality of distributed single input single output (SISO) compensators, the method comprising:

providing a graphical user interface (GUI) associated with a simulation environment for simulating the control system representation, the GUI incorporating a plurality of configurable views related to the control system representation;

receiving an input through the GUI to modify a parameter of a first SISO compensator of the plurality of distributed SISO compensators;

modifying the parameter of the first SISO compensator with a first modification in accordance with the received input, the parameter having a value representative of a substantially constant characteristic of the control system representation;

operating the first SISO compensator to generate a resulting output;

automatically updating one or more parameters of a remainder of the plurality of SISO compensators with a second modification based on the first modification and the resulting output of the first SISO compensator, the updating occurring contemporaneous with and resulting from modifying the parameter and operating the first SISO compensator;

operating the remainder of the plurality of the SISO compensators to generate one or more outputs, the remainder of the plurality of the SISO compensators including a second SISO compensator and a third SISO compensator; and simultaneously displaying the plurality of configurable views related to the control system representation with one or more updated parameters of the remainder of the plurality of SISO compensators, the plurality of configurable views related to the control system representation including a first plot of one or more outputs of the second SISO compensator and a second plot of one or more outputs of the third SISO compensator, the displaying occurring simultaneously with the modifying the parameter of the first SISO compensator.

2. The method of claim 1, further comprising providing a plurality of interfaces for modifying parameters in the plurality of SISO compensators, such that there is at least one interface for each of the plurality of SISO compensators.

3. The method of claim 2, wherein the plurality of interfaces are of a type comprising at least one of a graphical editor instance and a text editor instance.

4. The method of claim 1, wherein the input to modify is received by a first interface that is in communication with the first SISO compensator.

5. The method of claim 4, wherein modifying further comprises the first interface executing the modification to modify the parameter.

6. The method of claim 1, wherein the GUI displays outputs generated by at least one of the plurality of SISO compensators.

7. The method of claim 1, wherein the GUI provides user access to a plurality of tools for refining a design of the control system representation.

8. The method of claim 7, wherein the plurality of tools comprises at least one of an open loop tool, a closed loop tool, a Bode plot tool, a Nichols plot tool, a root/locus tool, a discretization tool, and a tuning tool.

9. The method of claim 1, wherein the automatic updating occurs in real-time.

10. The method of claim 1, wherein modifying further comprises a user entering the input through the GUI, and the GUI passing the input to the first SISO compensator for implementation.

11. In an electronic device, a method of manipulating a dynamic system representation having a plurality of distributed single input single output (SISO) compensators, the method comprising:

providing a simulation environment for simulating the dynamic system representation having the plurality of distributed SISO compensators, a SISO compensator representing an algorithm that computes commands for a plurality of components of the dynamic system representation, the dynamic system representation modeled in the simulation environment using one or more of differential equations, difference equations and algebraic equations;

generating, in the simulation environment, a linearized dynamic system representation by linearizing the dynamic system representation having the plurality of distributed SISO compensators;

modifying a parameter in a first SISO compensator of the plurality of distributed SISO compensators with a modification in accordance with an input, the parameter having a value representative of a substantially constant characteristic of the dynamic system representation;

the first SISO compensator generating a resulting output;

automatically updating one or more parameters of a remainder of the plurality of SISO compensators of the linearized dynamic system representation based on the modification to the parameter in the first SISO compensator and the resulting output of the first SISO compensator, the updating occurring contemporaneous with and resulting from the modification to the parameter and the first SISO compensator generating the resulting output, the remainder of the plurality of SISO compensators including a second SISO compensator and a third SISO compensator; and simultaneously displaying a first plot of an output of the second SISO compensator and a second plot of an output of the third SISO compensator to a user.

12. The method of claim 11, further comprising displaying a plurality of interfaces for the user to utilize for instructing the modification, such that there is at least one interface for each of the plurality of SISO compensators.

13. The method of claim 12, wherein the plurality of interfaces are of a type comprising at least one of a graphical editor instance and a text editor instance.

14. The method of claim 11, further comprising providing an editing graphical user interface (GUI) displaying at least one of a plurality of editor instances for the user to utilize in modifying parameters of the plurality of SISO compensators.

15. The method of claim 11, further comprising providing a display graphical user interface (GUI) for displaying outputs generated by at least one of the plurality of SISO compensators.

16. The method of claim 11, further comprising providing a configuration graphical user interface (GUI) for providing the user to access to a plurality of tools for refining a design of the dynamic system representation.

17. The method of claim 16, wherein the plurality of tools comprises at least one of an open loop tool, a closed loop tool, a Bode plot tool, a Nichols plot tool, a root/locus tool, a discretization tool, and a tuning tool.

18. The method of claim 11 wherein the automatic updating occurs in real-time.

19. The method of claim 11 wherein the modifying comprises the user entering the input through a graphical user interface (GUI), and the GUI passing the input to the first SISO compensator for implementation.

20. An electronic device, comprising:
a simulation environment for simulating a dynamic system representation having a plurality of distributed single input single output (SISO) compensators, a SISO compensator representing an algorithm that computes one or more commands for a plurality of components of the dynamic system representation, the dynamic system representation is modeled in the simulation environment using one or more of differential equations, difference equations and algebraic equations;
a linearization mechanism for generating a linearized dynamic system representation in the simulation environment by linearizing the dynamic system representation having the plurality of distributed SISO compensators;
an interface for instructing a modification to a parameter of a first SISO compensator of the plurality of distributed SISO compensators, the parameter having a value representative of a substantially constant characteristic of the dynamic system representation;
an update mechanism for automatically updating one or more parameters of a remainder of the plurality of SISO compensators of the linearized dynamic system based on the modification to the parameter of the first SISO compensator and a resulting output of the first SISO compensator, the update mechanism performing the updating contemporaneous with and as a result of the modification to the parameter of the first SISO, the remainder of the plurality of SISO compensators including a second SISO compensator and a third SISO compensator; and
a display device for simultaneously displaying a first plot of an output of the second SISO compensator and a second plot of an output of the third SISO compensator to a user.

21. The device of claim 20, further comprising a plurality of interfaces for modifying parameters of the plurality of SISO compensators, such that there is at least one interface for each of the plurality of SISO compensators.

22. The device of claim 21, wherein the plurality of interfaces are of a type comprising at least one of a graphical editor instance and a text editor instance.

23. The device of claim 20, wherein the interface comprises a first interface that is in communication with the first SISO compensator.

24. The device of claim 23, wherein the first interface executes the modification to modify the parameter.

25. The device of claim 20, wherein the interface comprises an editing graphical user interface (GUI) displaying at least one of a plurality of editor instances for modifying parameters of the plurality of SISO compensators.

26. The device of claim 20, wherein the interface comprises a configuration graphical user interface (GUI) for providing user access to a plurality of tools for refining a design of the dynamic system representation.

27. The device of claim 26, wherein the plurality of tools comprises at least one of an open loop tool, a closed loop tool, a Bode plot tool, a Nichols plot tool, a root/locus tool, a discretization tool, and a tuning tool.

28. The device of claim 20, wherein the update mechanism updates in real-time.

29. A medium holding one or more computer executable instructions for manipulating a dynamic system representation having a plurality of distributed single input single output (SISO) compensators, the medium comprising one or more instructions for:
providing a graphical user interface (GUI) associated with a simulation environment for simulating the control system representation, the GUI incorporating a plurality of configurable views related to the control system representation;
receiving an input through the GUI to modify a parameter of a first SISO compensator of the plurality of distributed SISO compensators;
modifying a parameter of the first SISO compensator with a first modification in accordance with the received input, the parameter having a value representative of a substantially constant characteristic of the dynamic system representation;
operating the first SISO compensator to generate a resulting output;
automatically updating one or more parameters of a remainder of the plurality of SISO compensators with a second modification based on the first modification and the resulting output of the first SISO compensator, the updating occurring contemporaneous with and resulting from modifying the parameter and operating the first SISO compensator;
operating the remainder of the plurality of SISO compensators to generate one or more outputs, the remainder of the plurality of the SISO compensators including a second SISO compensator and a third SISO compensator; and
simultaneously displaying the plurality of configurable views related to the control system representation with one or more updated parameters of the remainder of the plurality of SISO compensators, the plurality of configurable views related to the control system representation including a first plot of one or more outputs of the second SISO compensator and a second plot of one or more outputs of the third SISO compensator, the displaying occurring simultaneously with the modifying the parameter of the first SISO compensator.

30. The medium of claim 29, further comprising one or more instructions for:
providing a plurality of interfaces for modifying parameters of the plurality of SISO compensators, such that there is at least one interface for each of the plurality of SISO compensators.

31. The medium of claim 30, wherein the plurality of interfaces are of a type comprising at least one of a graphical editor instance and a text editor instance.

32. The medium of claim 29, wherein the input to modify is received by a first interface that is in communication with the first SISO compensator.

33. The medium of claim 32, wherein modifying further comprises the first interface executing the modification to modify the parameter.

34. The medium of claim 29, wherein the GUI displays outputs generated by at least one of the plurality of SISO compensators.

35. The medium of claim 29, wherein the GUI provides user access to a plurality of tools for refining a design of the dynamic system representation.

36. The medium of claim 35, wherein the plurality of tools comprises at least one of an open loop tool, a closed loop tool, a Bode plot tool, a Nichols plot tool, a root/locus tool, a discretization tool, and a tuning tool.

37. The medium of claim 29, wherein the automatic updating occurs in real-time.

38. The medium of claim 29, wherein the modifying further comprises:

receiving the input from a user via the GUI; and passing the input to the first SISO compensator for implementation.

39. The method of claim 1, wherein the input includes an instruction.

40. The medium of claim 29, wherein the input includes an instruction.

41. The method of claim 1, wherein the control system representation is modeled in the simulation environment using one or more of differential equations, difference equations and algebraic equations.

* * * * *